(12) United States Patent
Izadi

(10) Patent No.: US 10,574,222 B1
(45) Date of Patent: Feb. 25, 2020

(54) HIGH SPEED HIGH VOLTAGE DRIVERS

(71) Applicant: PsiQuantum Corp., Palo Alto, CA (US)

(72) Inventor: Arash Izadi, Sunnyvale, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

(21) Appl. No.: 16/407,128

(22) Filed: May 8, 2019

(51) Int. Cl.
*H03K 17/0412* (2006.01)

(52) U.S. Cl.
CPC .............................. *H03K 17/04123* (2013.01)

(58) Field of Classification Search
None
See application file for complete search history.

(56) References Cited

U.S. PATENT DOCUMENTS

| | | | | |
|---|---|---|---|---|
| 6,388,470 B1* | 5/2002 | Mattos | ............... | H03K 19/0016 326/57 |
| 8,446,173 B1* | 5/2013 | Faucher | ........... | H03K 19/00361 326/27 |
| 9,899,918 B2* | 2/2018 | Lee | ........................ | H02M 3/158 |
| 2003/0025541 A1* | 2/2003 | Humphrey | ............... | H03K 5/12 327/170 |
| 2013/0257490 A1* | 10/2013 | Kanayama | ....... | H03K 3/356113 327/109 |
| 2015/0092499 A1* | 4/2015 | Song | .................. | H03K 19/0027 365/185.23 |

OTHER PUBLICATIONS

Liu, N over N Cascode Push Pull Modulator Driver in 130 nm CMOS Enabling 20 Gb/s Optical Interconnection with Mach-Zehnder Modulator, Electronics Letters, Jun. 12, 2015, 2 pgs.
Palermo, High-Speed Transmitters in 90nm CMOS for High-Density Optical Interconnects, Computer Systems Laboratory, Stanford University, 2006, 4 pgs.
Pashmineh, Design of High Speed High-Voltage Drivers Based on Stacked Standard CMOS for Various Supply Voltages, Institut of Microelectronics, Ulm University, Germany, 2013, 4 pgs.

\* cited by examiner

*Primary Examiner* — Cassandra F Cox
(74) *Attorney, Agent, or Firm* — Morgan, Lewis & Bockius LLP

(57) ABSTRACT

A voltage driver is provided that includes a driver circuit, comprising (i) first positive channel transistor devices (PCTDs) coupled in series between a reference node and an output node; and (ii) first negative channel transistor devices (NCTDs) coupled in series between the output node and an electrical ground node. The voltage driver further includes a speed-up circuit comprising: (i) second NCTDs coupled to the first PCTDs, configured to discharge gate-source capacitances of the first PCTDs; and (ii) second PCTDs coupled to the first NCTDs, configured to discharge gate-source capacitances of the first NCTDs. The voltage driver further includes a gate voltage circuit coupled to the driver circuit that includes third NCTDs and third PCTDs to provide respective first and second gate voltages to each of a subset of the first PCTDs and a subset of the first NCTDs.

8 Claims, 9 Drawing Sheets

HIGH SPEED HIGH VOLTAGE DRIVERS

TECHNICAL FIELD

The present disclosure relates to voltage drivers, and more particularly to voltage drivers suitable for switching high voltages at high speeds.

BACKGROUND

Some electronics applications require complementary metal-oxide-semiconductor (CMOS) processes that operate at high voltages. Typically, these processes use special transistors that are specifically designed to tolerate such high voltages, such as laterally diffused MOSFETs (LDMOS). However, these devices are only available for some processes, generally suffer from worse performance, and operate at slower speeds than standard CMOS devices.

SUMMARY

There is a need for voltage drivers suitable for switching high voltages at high speeds. This need arises, for example, in feed-forward electro-optical-circuits where CMOS devices are used to drive an optical switch at high speed. To that end, some embodiments described herein provide CMOS voltage driver devices with stacked transistor devices (e.g., arranged in series, with p-type devices on top and n-type devices on bottom in a cascode arrangement), such that the stack supports a larger voltage difference than the individual transistor devices without damaging the individual transistor devices. In some embodiments, the transistor stacks are backed by a speed-up circuit, which discharges the transistor devices' parasitic capacitances when the transistor devices are turned off, greatly increasing the speed at which the voltage driver devices can operate. In this manner, transistor devices designed to operate at standard voltages (e.g., 3.3 V) can be stacked to an arbitrarily large number, providing an arbitrarily large voltage range, while retaining the speed and performance benefits of transistor devices designed to operate at standard voltages. The embodiments (A1)-(A8), described below, provide some or all of these benefits.

(A1) In some embodiments, a voltage driver device is provided. The voltage driver device includes a driver circuit. The driver circuit includes a first set of positive channel transistor devices (PCTDs) coupled in series between a first reference node and an output node. The first set of PCTDs includes at least three PCTDs. The driver circuit further includes a first set of negative channel transistor devices (NCTDs) coupled in series between the output node and an electrical ground node. The first set of NCTDs includes at least three NCTDs. The voltage driver device further includes a control circuit coupled to the driver circuit. The control circuit includes a speed-up circuit coupled to the driver circuit. The speed-up circuit includes: (i) a second set of NCTDs coupled to the first set of PCTDs and configured to selectively discharge gate-source capacitances of the first set of PCTDs; and (ii) a second set of PCTDs coupled to the first set of NCTDs and configured to selectively discharge gate-source capacitances of the first set of NCTDs. The speed-up circuit is configured to speed-up operation of the driver circuit via the selective discharging of gate-source capacitances. The voltage driver device further includes a gate voltage circuit coupled to the driver circuit that comprises a third set of NCTDs and a third set of PCTDs. The gate voltage circuit is configured to selectively provide respective first and second gate voltages to each of: at least a subset of the first set of PCTDs, and at least a subset of the first set of NCTDs.

(A2) In some embodiments of (A1), each transistor device in the first set of PCTDs and the first set of NCTDs has a same associated drain-to-source reliability voltage threshold. A voltage difference between the first reference node and the electrical ground node is more than two times the drain-to-source reliability voltage threshold.

(A3) In some embodiments of (A2), the driver circuit is configured to operate in: (i) a first mode during which the first set of NCTDs are in an on state and the first set of PCTDs are in an off state; and (ii) a second mode during which the first of PCTDs are in an on state and the first set of NCTDs are in an off state. The control circuit is configured to transition the driver circuit between the first mode and the second mode by: (i) sequentially transitioning on respective PCTDs in the first set of PCTDs such that a magnitude of a drain-to-source voltage of each PCTD in the first set of PCTDs does not exceed the drain-to-source reliability voltage threshold; and (ii) sequentially transitioning off respective NCTDs in the first set of NCTDs such that a magnitude of a drain-to-source voltage of each NCTD in the first set of NCTDs does not exceed the drain-to-source reliability voltage threshold.

(A4) In some embodiments of (A3), the voltage difference between the first reference node and the electrical ground node is M times greater than an average drain-to-source voltage drop across the PCTDs in the first set of PCTDs in the first mode, and is M times greater than the average drain-to-source voltage drop across the NCTDs in the first set of NCTDs in the second mode. The first set of PCTDs includes M PCTDs and the first set of NCTDs includes M NCTDs.

(A5) In some embodiments of (A4), the voltage driver device further includes a voltage circuit configured to provide M−1 reference voltages, between zero and the voltage on the first reference node, corresponding to respective multiples of the average drain-to-source voltage drop across the PCTDs in the first set of PCTDs in the first mode, and respective multiples of the average drain-to-source voltage drop across the NCTDs in the first set of NCTDs in the second mode.

(A6) In some embodiments of (A5), the respective first and second gate voltages are each: zero voltage, the voltage on the first reference node, or one of the M−1 reference voltages.

(A7) In some embodiments of any of (A1)-(A6), the voltage driver device further comprises an input circuit coupled to the driver circuit. The input circuit includes one or more signal buffers and a level shifting circuit configured to adjust a level of an input signal to correspond to the voltage on the first reference node.

(A8) In some embodiments of any of (A1)-(A7), for each NCTD of the second set of NCTDs: a source terminal of the NCTD is electrically connected to a gate terminal of a first corresponding PCTD of the first set of PCTDs; a drain terminal of the NCTD is electrically connected to a source terminal of the first corresponding PCTD; a gate terminal of the NCTD is electrically connected to a gate terminal of a second corresponding PCTD of the first set of PCTDs; and the source terminal of the first corresponding PCTD is electrically connected to a drain terminal of the second corresponding PCTD. For each PCTD of the second set of PCTDs: a drain terminal of the PCTD is electrically connected to a source terminal of a first corresponding NCTD of the first set of NCTDs; a gate terminal of the PCTD is electrically connected to a gate terminal of a second corresponding NCTD; a source terminal of the PCTD is electrically connected to a gate terminal of the first corresponding NCTD of the first set of NCTDs; and a source terminal of the first corresponding NCTD is electrically connected to the drain terminal of the second corresponding NCTD.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
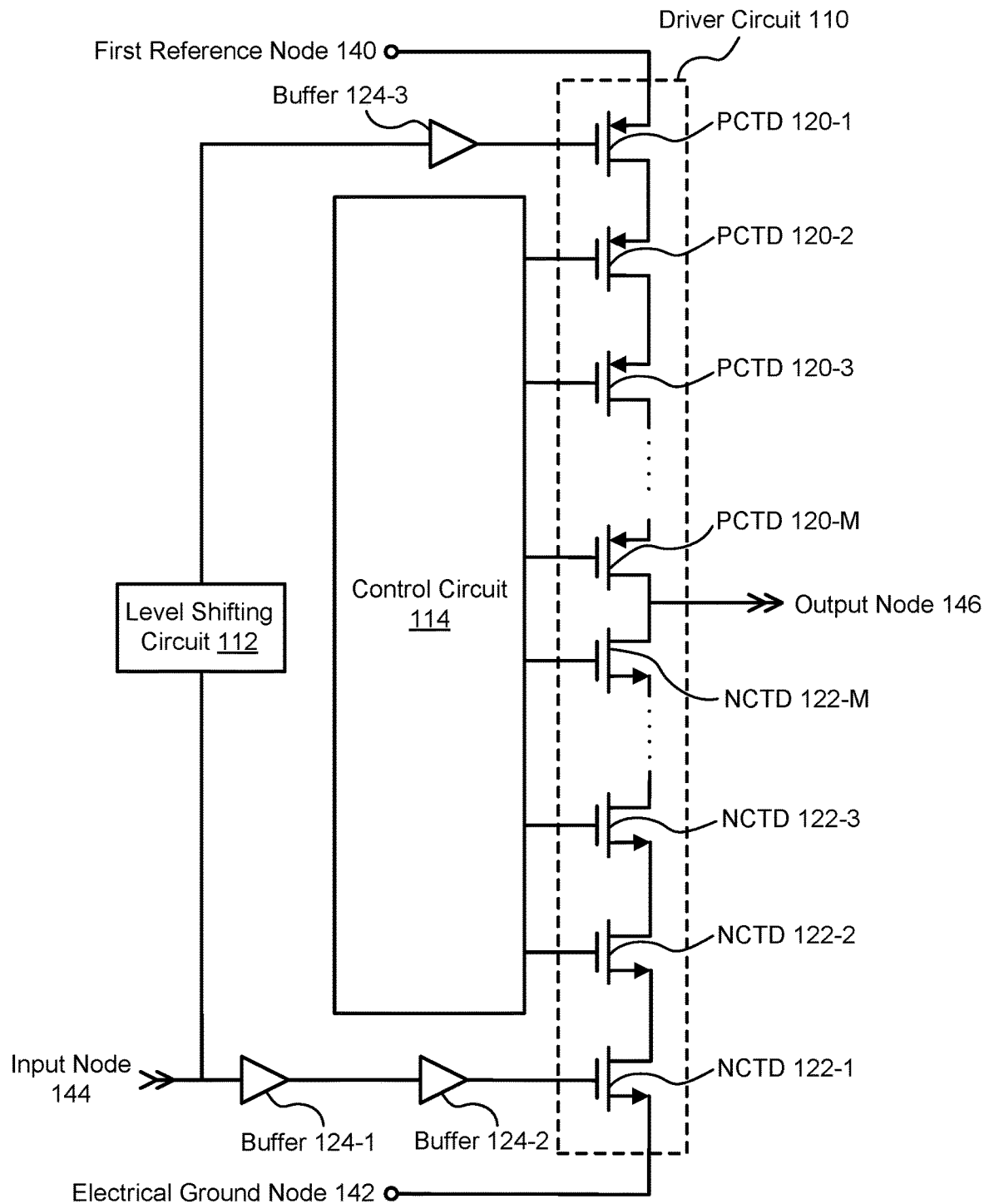
FIG. 1 is a circuit diagram illustrating a voltage driver device in accordance with some embodiments.

FIG. 1 is a circuit diagram illustrating a voltage driver device 100 in accordance with some embodiments. The voltage driver device 100 includes a driver circuit 110 and a control circuit 114 coupled to the driver circuit 110. The voltage driver device further includes, as terminals, a first reference node 140, an electrical ground node 142, an input node 144 and an output node 146. The input node 144 is coupled to buffers 124. For example, input node 144 is coupled directly to buffer 124-1, coupled to buffer 124-2 through buffer 124-1, and coupled to buffer 124-3 through a level shifting circuit 112.

The driver circuit 110 includes a first set of positive channel transistor devices (PCTDs) 120 (e.g., PCTD 120-1 through PCTD 120-M) coupled in series between the first reference node 140 and the output node 146. The driver circuit 110 includes a first set of negative channel transistor devices (NCTDs) 122 (e.g., NCTD 122-1 through NCTD 122-M) coupled in series between the output node 146 and the electrical ground node 142. In some embodiments, the first set of PCTDs 120 is connected in a cascode arrangement with the first set of NCTDs 122. In some embodiments, the first set of NCTDs 122 includes at least three NCTDs. In some embodiments, the first set of PCTDs 120 includes at least three PCTDs. In some embodiments, the first set of PCTDs 120 includes M PCTDs, where M is an integer (e.g., 3, 4, 5, or more). In some embodiments, the first set of NCTDs 122 includes M NCTDs. In some embodiments, the first set of PCTDs 120 includes the same number of transistor devices as the first set of NCTDs 122.

In some embodiments, the PCTDs described throughout this disclosure are p-type field effect transistors (pFETs). In some embodiments, the NCTDs described throughout this disclosure are n-type field effect transistors (nFETs). In some embodiments, the PCTDs described throughout this disclosure are p-type metal-oxide-semiconductor (pMOS) devices. In some embodiments, the NCTDs described throughout this disclosure are n-type metal-oxide-semiconductor (nMOS) devices.

In some embodiments, voltage driver device 100 drives output node 146 either to ground (e.g., 0 V), also called circuit ground, or a predefined high voltage. In some embodiments, the predefined high voltage is an integer multiple of a power supply voltage $V_{dd}$. In some embodiments, the power supply voltage is 3.3 V. For example, when the first set of PCTDs 120 includes M PCTDs (or, equivalently, the first set of NCTDs 122 includes M NCTDs), the output voltage (e.g., the voltage at output node 146) will vary between 0 V and $M*V_{dd}$.

In some embodiments, the input (e.g., the voltage on input node 144) is a binary logic value, such that the input can be in either of two states (e.g., a low state in which the input voltage is zero and high state in which the input voltage is at the power supply voltage $V_{dd}$). In some embodiments, when the input (e.g., the voltage on input node 144) is low (e.g., 0 V), the first set of NCTDs 122 are turned off and the first set of PCTDs 120 are turned on, pushing the output voltage to $M*V_{dd}$. In contrast, when the input is high (e.g., $V_{dd}$), the first set of NCTDs 122 are turned on and the first set of PCTDs 120 are turned off, pulling the output voltage to ground (e.g., 0 V). Note that the high voltage need not be equal to $M*V_{dd}$, but in some embodiments should be no greater than $M*V_{dd}$ to avoid damaging the transistor devices.

In some embodiments, each respective transistor device in the first set of PCTDs 120 has an associated drain-to-source reliability threshold voltage (e.g., a maximum drain-source voltage at which the respective transistor device is rated and/or expected to function properly). Typically, each respective transistor device in the first set of PCTDs 120 has the same associated drain-to-source reliability threshold. In some embodiments, each respective transistor device in the first set of NCTDs 122 has an associated drain-to-source reliability threshold voltage. Typically, each respective transistor device in the first set of NCTDs 122 has the same associated drain-to-source reliability threshold. In some embodiments, each transistor device in the first set of PCTDs 120 and the first set of NCTDs 122 has a same associated drain-to-source reliability voltage threshold. In some circumstances, the power supply voltage $V_{dd}$ is set to the drain-to-source reliability voltage threshold for the transistor devices in voltage driver device 100.

In some embodiments, a voltage difference between the first reference node 140 and the electrical ground node 142 is more than two times the drain-to-source reliability voltage threshold (or more than two times the power supply voltage $V_{dd}$). In some embodiments, the voltage on the output node 146 is driven either to the voltage on the first reference node 140 (e.g., $4*V_{dd}$) or the voltage on the electrical ground node 142 (e.g., 0 V), depending on a voltage input on input node 144. For example, when a first predefined voltage (e.g., $V_{dd}$) is applied to the input node 144, the voltage on output node 146 is driven by voltage driver device 100 to the voltage on the electrical ground node 142 (e.g., 0 V). More particularly, applying the first predefined voltage to the input node 144 places voltage device driver 100 in a first mode in which the first set of NCTDs 122 are in an on state (pulling output node 146 to ground) and the first set of PCTDs 120 are in an off state (electrically isolating output node 146 from first reference node 140). When a second predefined voltage (e.g., 0 V) is applied to the input node 144, the voltage on output node 146 is driven by voltage driver device 100 to the voltage on the first reference node 140 (e.g., $4*V_{dd}$). More particularly, applying the second predefined voltage to the input node 144 places voltage device driver 100 in a second mode during which the first set of PCTDs 120 are in an on state (pushing the output node 146 to the voltage on first reference node 140) and the first set of NCTDs 122 are in an off state (electrically isolating the output node 146 from ground). In the on state, transistor devices such as the NCTDs and PCTDs described herein provide a conductive path from source to drain. In the off state, transistor devices such as the NCTDs and PCTDs described herein have a high resistance between source and drain.

In some embodiments, the voltage difference between the first reference node 140 and the electrical ground node 142 is M times greater than an average drain-to-source voltage drop across the PCTDs in the first set of PCTDs 120 in the first mode, and is M times greater than the average drain-to-source voltage drop across the NCTDs in the first set of NCTDs 122 in the second mode. Thus, in the first mode (with all of the NCTDs 122 on and the output node 146 pulled to ground), the PCTDs 120 are off. In this mode, the PCTDs 120 act as a voltage divider, stepping down the voltage from the voltage on the first reference node 140 to ground in increments that do not exceed the drain-to-source reliability voltage threshold for the transistor devices. In the second mode (with all of the PCTDs 120 on and the output node 146 pushed to the voltage on the first reference node 140), the NCTDs 122 are off. In this mode, NCTDs 122 act as a voltage divider, stepping down the voltage from the voltage on the first reference node 140 to ground in increments that do not exceed the drain-to-source reliability voltage threshold for the transistor devices.

In this manner, voltage driver device 100 amplifies an input signal (e.g., the voltage on input node 144) to produce a predefined multiple of the input signal. In some embodiments, voltage driver device 100 does so, without damaging the transistor devices, by stacking the first set of NCTDs 122 and the first set of PCTDs 120 in a cascode arrangement, as shown in FIG. 1.

Figure 2A:
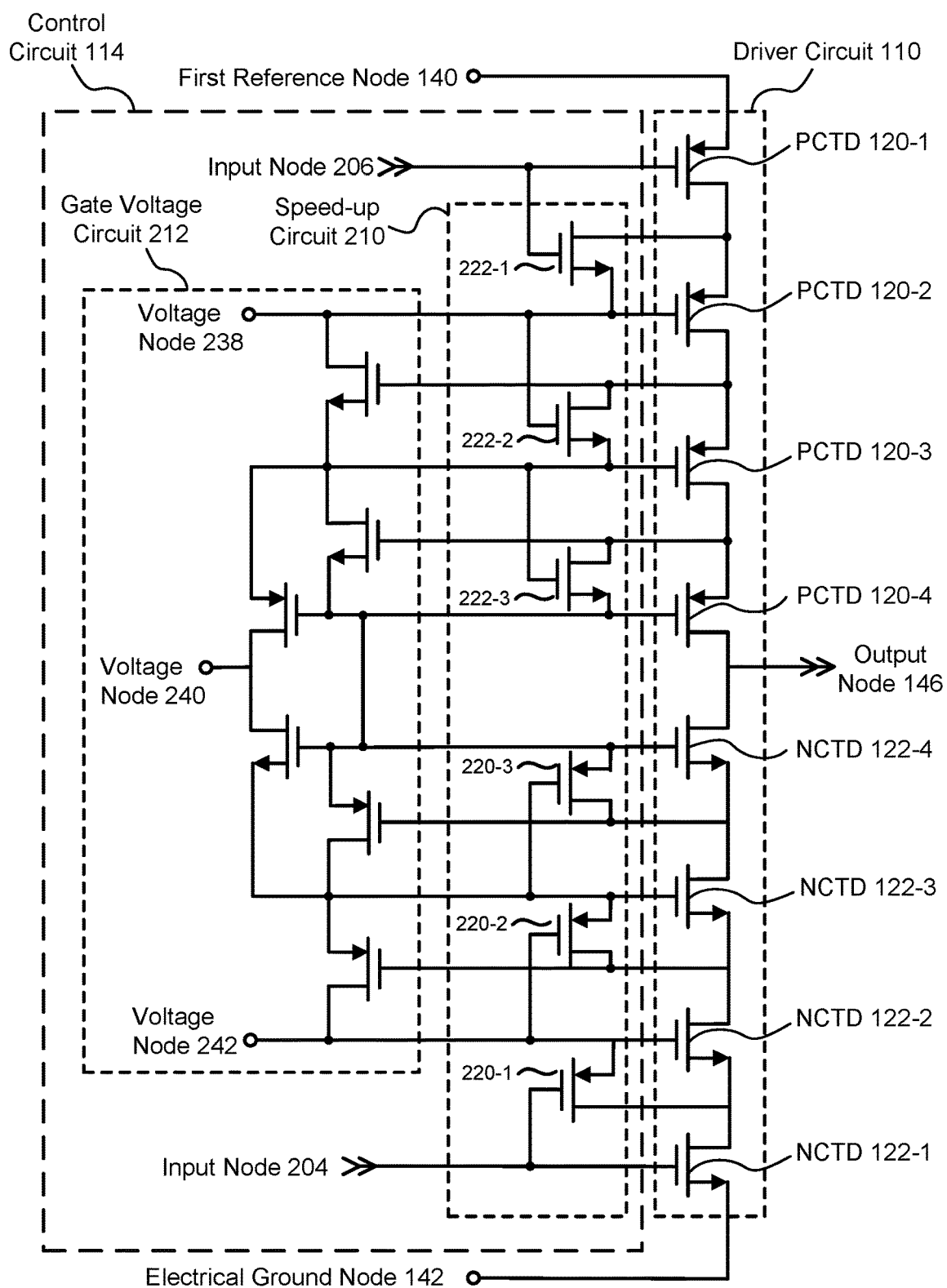
FIGS. 2A-2B are circuit diagrams illustrating a voltage driver device in accordance with some embodiments.
Figure 2B:
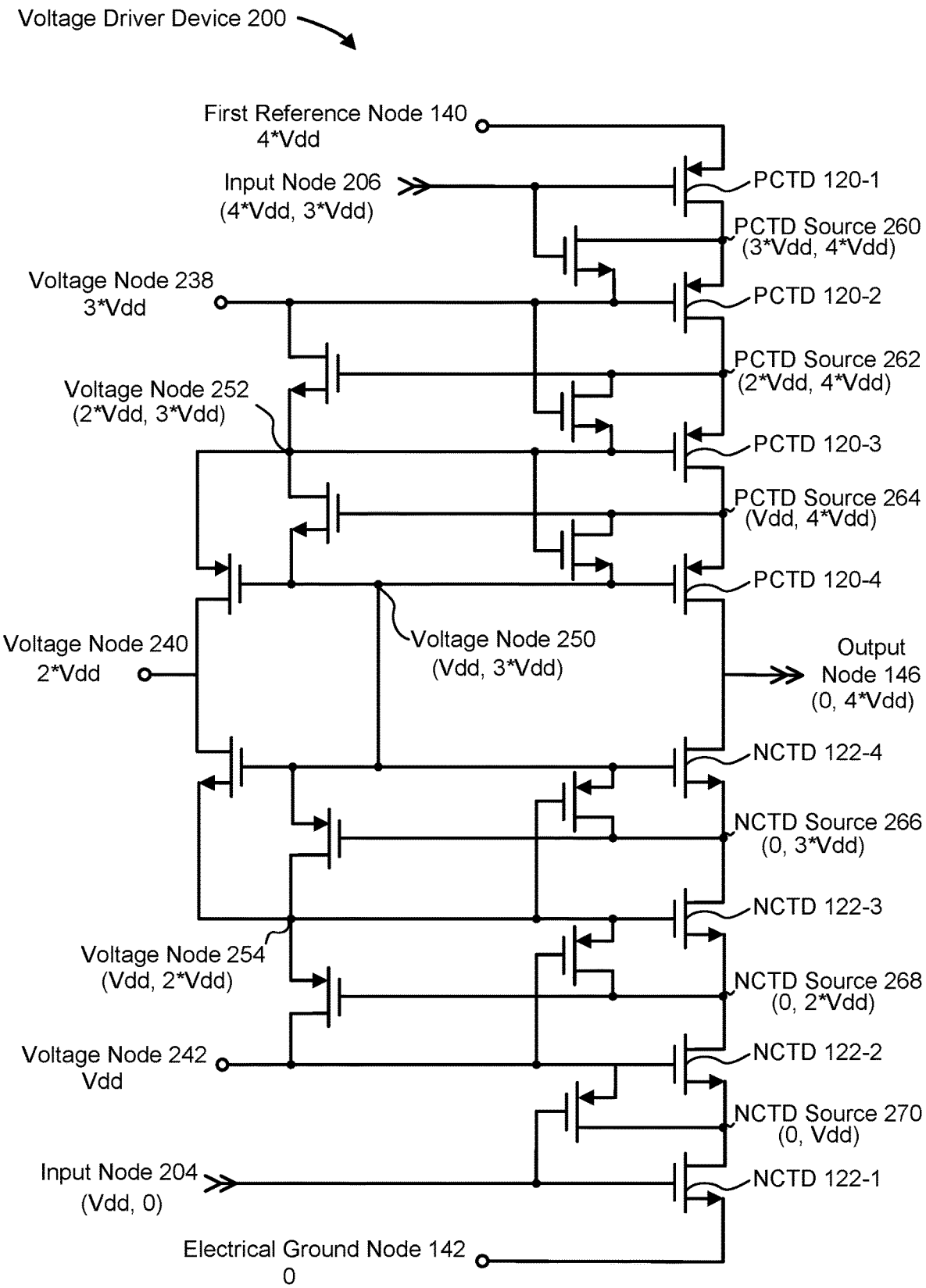

In some embodiments, voltage driver device 100 includes one or more buffers 124 (e.g., buffer 124-1 through buffer 124-3) and a level shifting circuit 112 configured to adjust a level of an input signal (e.g., the signal input on input node 144) to correspond to the voltage on the first reference node 140 (e.g., to take on appropriate values to turn on/off transistor devices in the top half of the voltage driver device 100). In some embodiments, as shown in FIGS. 2A-2B the one or more buffers 124 and the level shifting circuit 112 are components in a control circuit 114. In some embodiments, buffers 124 are signal buffers. In some embodiments, the level shifting circuit 112 shifts the input signal upward, in voltage, by $(M-1)*V_{dd}$ to correspond to the voltage on the first reference node 140. In some embodiments, the magnitude of the shifted input signal remains the same, with a total voltage swing of $V_{dd}$ between the low state and high state of the input signal. For example, in the example shown in FIGS. 2A-2B, input node 206 receives the level shifted signal from buffer 124-3. Furthermore, in some embodiments, the purpose of buffers 124 is to ensure that input signal changes are received at NCTD 122-1 and PCTD 120-1 at the same time, or almost exactly the same time, within a tolerance of ten percent, or in some implementations twenty percent, of the NCTD 122-1 rise or fall time in response to an input signal transition.

FIGS. 2A-2B are circuit diagrams illustrating a voltage driver device 200 in accordance with some embodiments. In some embodiments, the voltage driver device 200 may share any of the features or aspects of voltage driver device 100, discussed above with respect to FIG. 1. For brevity, those details are not repeated here. The voltage driver device 200 shown in FIG. 2A-2B, however, is an example in which the first set of PCTDs 120 includes four PCTDs and the first set of NCTDs 122 includes four NCTDs (e.g., M=4). In addition, voltage driver device 200 provides an example with additional detail on some embodiments in which control circuit 114 includes a speed-up circuit 210 and a gate voltage circuit 212.

Note that, in some embodiments, input node 204 is analogous to input node 144 (FIG. 1). In some embodiments, the voltage on input node 206 is tied to the voltage on input node 204 through level shifting circuit 112 (FIG. 1). Thus, in some embodiments, the voltage on input node 206 is level shifted with respect to the voltage on input node 204. In some embodiments, the voltage on input node 206 corresponds to the voltage on first reference node 140, such that the voltage on input node 206 is either equal to, or $V_{dd}$ less than, the voltage on first reference node 140 (depending on whether the device is in the first mode or the second mode).

The speed-up circuit 210 speeds up operation of the driver circuit 110 via selective discharging of gate-source capacitances of the PCTDs 120 and the NCTD 122. In some embodiments, the speed-up circuit 210 includes a second set of NCTDs 222 (e.g., NCTD 222-1 through NCTD 222-3) coupled to the first set of PCTDs 120. The second set of NCTDs 222 are configured to selectively discharge gate-source capacitances of the first set of PCTDs 120. For example, when transitioning from the second mode to the first mode (e.g., 0 V output), NCTD 222-1 discharges a gate-source capacitance of PCTD 120-2; NCTD 222-2 discharges a gate-source capacitance of PCTD 120-3; and NCTD 222-3 discharges a gate-source capacitance of PCTD 120-4. In some embodiments, the speed-up circuit 210 also includes a second set of PCTDs 220 (e.g., PCTD 220-1 through PCTD 220-3) coupled to the first set of NCTDs 122. The second set of PCTDs 220 are configured to selectively discharge gate-source capacitances of the first set of NCTDs 122, for example when transitioning from the first mode (e.g., 0 V output) to the second mode (e.g., $M*V_{dd}$ output). For example, when transitioning from the first mode to the second mode, PCTD 220-1 discharges a gate-source capacitance of NCTD 122-2; PCTD 220-2 discharges a gate-source capacitance of NCTD 122-3; and PCTD 220-3 discharges a gate-source capacitance of NCTD 122-4.

In some embodiments, for a respective NCTD 222 of the second set of NCTDs 222, a source terminal of the respective NCTD 222 is electrically connected to a gate terminal of a first corresponding PCTD of the first set of PCTDs 120. A drain terminal of the respective NCTD 222 is electrically connected to a source terminal of the first corresponding PCTD 120. A gate terminal of the respective NCTD 222 is electrically connected to a gate terminal of a second corresponding PCTD of the first set of PCTDs 120. The source terminal of the first corresponding PCTD 120 is electrically connected to a drain terminal of the second corresponding PCTD 120 (e.g., the first corresponding PCTD 120 and the second corresponding PCTD 120 are adjacent PCTDs in the first set of PCTDs 120, which are connected in series). In some embodiments, each NCTD 222 of the second set of NCTDs 222 is connected in this manner. For example, a source terminal of NCTD 222-1 is electrically connected to a gate terminal of PCTD 120-2 (e.g., the first corresponding PCTD). A drain terminal of NCTD 222-1 is electrically connected to a source terminal of PCTD 120-2. A gate terminal of NCTD 222-1 is electrically connected to a gate terminal of PCTD 120-1 (e.g., the second corresponding PCTD). The source terminal of the PCTD 120-2 is electrically connected to a drain terminal of the PCTD 120-1.

In some embodiments, for each PCTD 220 of the second set of PCTDs 220, a drain terminal of the PCTD 220 is electrically connected to a source terminal of a first corresponding NCTD 122 of the first set of NCTDs 122. A gate terminal of the PCTD 220 is electrically connected to a gate terminal of a second corresponding NCTD 122. A source terminal of the PCTD 220 is electrically connected to a gate terminal of the first corresponding NCTD 122 of the first set of NCTDs 122. A source terminal of the first corresponding NCTD 122 is electrically connected to the drain terminal of the second corresponding NCTD 122. For example, a drain terminal of PCTD 220-1 is electrically connected to a source terminal of NCTD 122-2 (the first corresponding NCTD). A gate terminal of the PCTD 220-1 is electrically connected to a gate terminal of NCTD 122-1 (the second corresponding NCTD). A source terminal of the PCTD 220-1 is electrically connected to a gate terminal of NCTD 122-2. A source terminal of NCTD 122-2 is electrically connected to the drain terminal of NCTD 122-1.

The gate voltage circuit 212 is coupled to the driver circuit 110. In some embodiments, the gate voltage circuit 212 includes a third set of NCTDs (described in greater detail below) and a third set of PCTDs (described in greater detail below). The gate voltage circuit 212 is configured to selectively provide respective first and second gate voltages to each of: at least a subset of the first set of PCTDs 120, and at least a subset of the first set of NCTDs 122. In some embodiments, one of the respective first and second gate voltages is selected to ensure the corresponding transistor device in the drive circuit has low resistance when the transistor device is turned on, and the other of the first and second gate voltages is selected to match the source voltage when the transistor device is turned off. In some embodiments, the reduced resistance results in faster operation (e.g., reduces the resistance-capacitance (RC) time constant for the voltage driver device 200).

In some embodiments, the control circuit 114 is configured to transition the driver circuit 110 between the first mode (in which all of the NCTDs 122 are on, all of the PCTDs 120 are off, and the output node 146 is pulled to ground) and the second mode (in which all of the PCTDs 120 are on, all of the NCTDs 122 are off, and the output node 146 is pushed to the voltage on the first reference node 140) by: sequentially transitioning on respective PCTDs 120 in the first set of PCTDs 120 such that a magnitude of a drain-to-source voltage of each PCTD 120 in the first set of PCTDs 120 does not exceed the drain-to-source reliability voltage threshold; and sequentially transitioning off respective NCTDs 122 in the first set of NCTDs 122 such that a magnitude of a drain-to-source voltage of each NCTD 122 in the first set of NCTDs 122 does not exceed the drain-to-source reliability voltage threshold (e.g., to transition from the first mode to the second mode). For transitioning from the second mode to the first mode, the control circuit 114 is configured to sequentially transition off respective PCTDs 120 in the first set of PCTDs 120 (i.e., in the driver circuit 110) such that a magnitude of a drain-to-source voltage of each PCTD 120 in the first set of PCTDs 120 does not exceed the drain-to-source reliability voltage threshold, and to sequentially transition on respective NCTDs 122 in the first set of NCTDs 122 (i.e., in the driver circuit 110) such that a magnitude of a drain-to-source voltage of each NCTD 122 in the first set of NCTDs 122 does not exceed the drain-to-source reliability voltage threshold.

FIG. 2B shows steady-state voltages for select nodes of the voltage driver device 200, in accordance with some embodiments. In particular, voltage levels that are not in parentheses do not change in this example. For example, during operation, electrical ground node 142 remains at 0 V, voltage node 242 remains at $V_{dd}$, voltage node 240 remains at $2*V_{dd}$, voltage node 238 remains at $3*V_{dd}$, and reference node 140 remains at $4*V_{dd}$. Nodes that have two voltage values in parentheses can take on either of those values, depending on the voltage applied to the input node 204. For example, when the voltage on input node 204 is $V_{dd}$, the voltage at the various other nodes is the first of the two values in parentheses. Thus, when the voltage on input node 204 is \Tad:

the voltage on voltage node 254 is $V_{dd}$;
the voltage on voltage node 252 is $2*V_{dd}$;
the voltage on input node 206 is $4*V_{dd}$;
the voltage on voltage node 250 is $V_{dd}$;
the voltage on PCTD source 260 is $3*V_{dd}$;
the voltage on PCTD source 262 is $2*V_{dd}$;
the voltage on PCTD source 264 is $V_{dd}$;
the voltage on output node 146 is 0; and
the voltages on NCTD source 266, NCTD source 268, and NCTD source 270 are all 0.

When the voltage on input node 204 is 0, the voltage at the various other nodes is the second of the two values in parentheses. Thus, when the voltage on input node 204 is 0:

the voltage on voltage node 254 is $2*V_{dd}$;
the voltage on voltage node 252 is $3*V_{dd}$;
the voltage on input node 206 is $3*V_{dd}$;
the voltage on voltage node 250 is $3*V_{dd}$;
the voltages on PCTD source 260; PCTD source 262; and PCTD source 264 are all $4*V_{dd}$;
the voltage on output node 146 is $4*V_{dd}$;
the voltage on NCTD source 266 is $3*V_{dd}$;
the voltage on NCTD source 268 is $2*V_{dd}$; and
the voltage on NCTD source 270 is $V_{dd}$.

Note that, in the examples given above, voltage driver device 200 is configured such that the average drain-to-source voltage drop, when transistor devices are in an off state, is the power supply voltage $V_{dd}$ (which does not exceed, and is generally less than the drain-to-source reliability voltage threshold) thus providing a voltage swing between 0 and $4*V_{dd}$ (or, more generally, 0 and $M*V_{dd}$ for an M-over-M cascode device). However, the average drain-to-source voltage drop can, in accordance with some embodiments, be less than the power supply voltage $V_{dd}$, thus providing a voltage swing between 0 and a value less than $4*V_{dd}$ (or, more generally, 0 and a value less than $M*V_{dd}$ for an M-over-M cascode device).

Figure 3A:
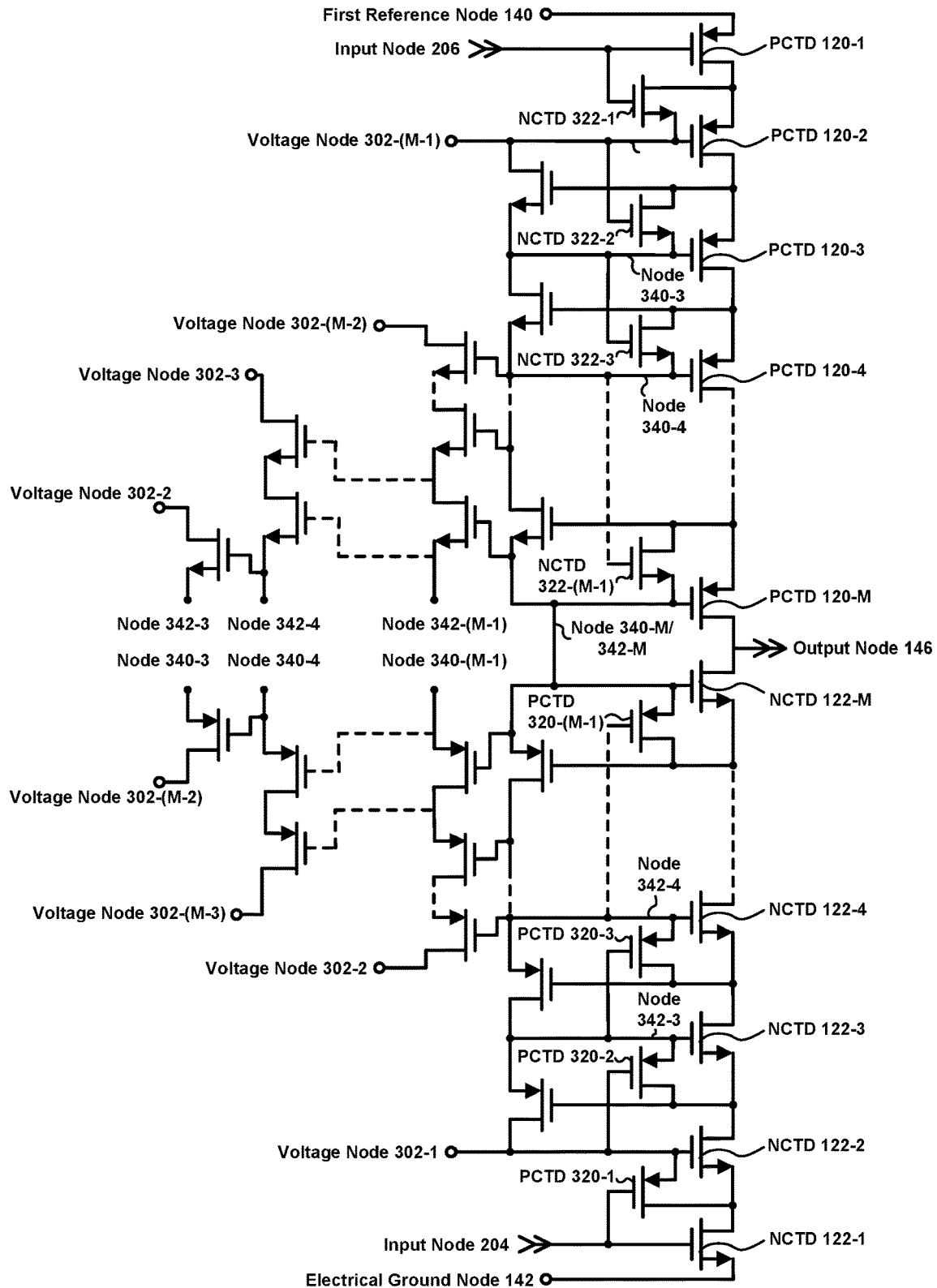
FIGS. 3A-3C are circuit diagrams illustrating a voltage driver device in accordance with some embodiments.
Figure 3B:
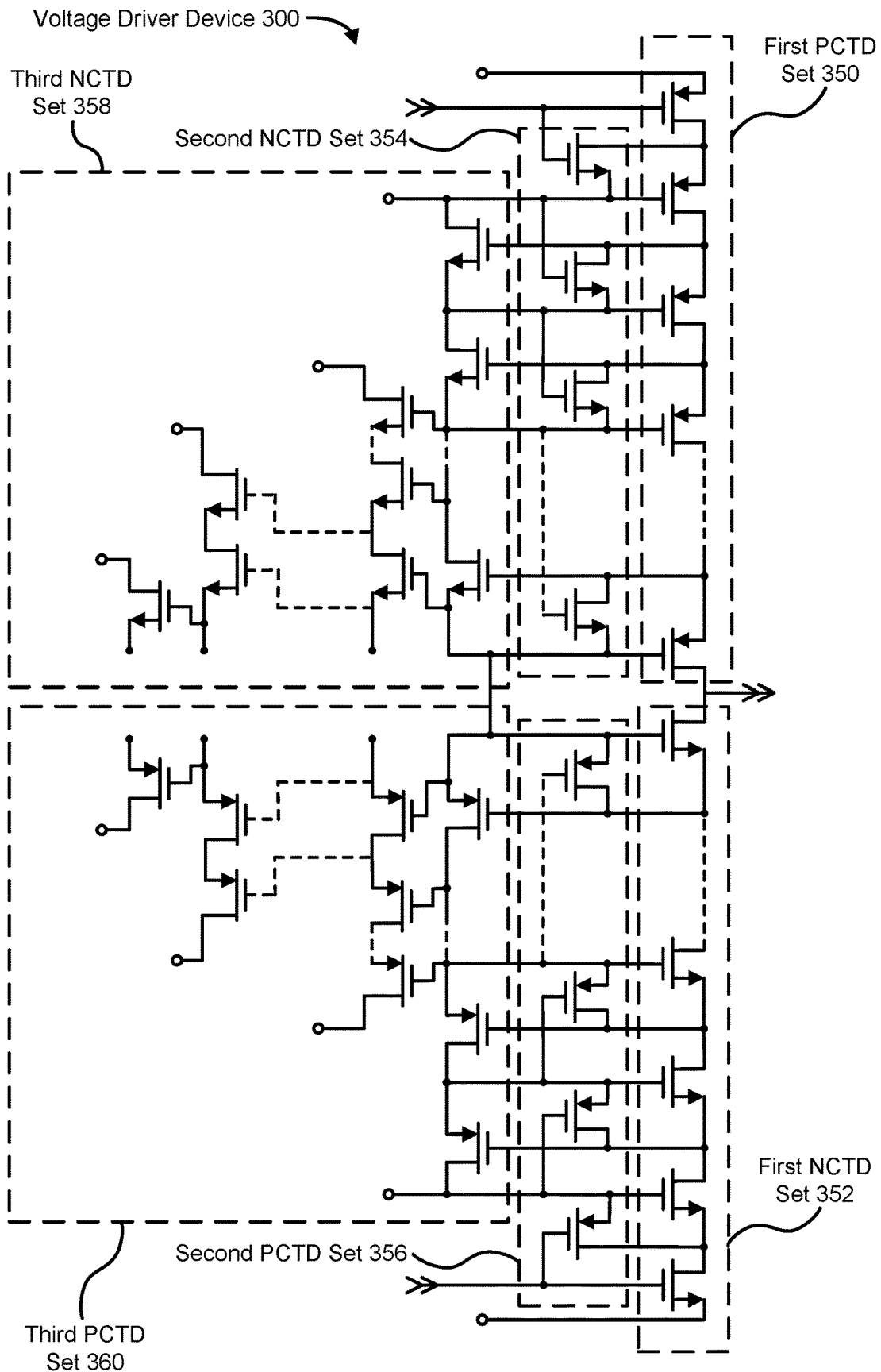
Figure 3C:
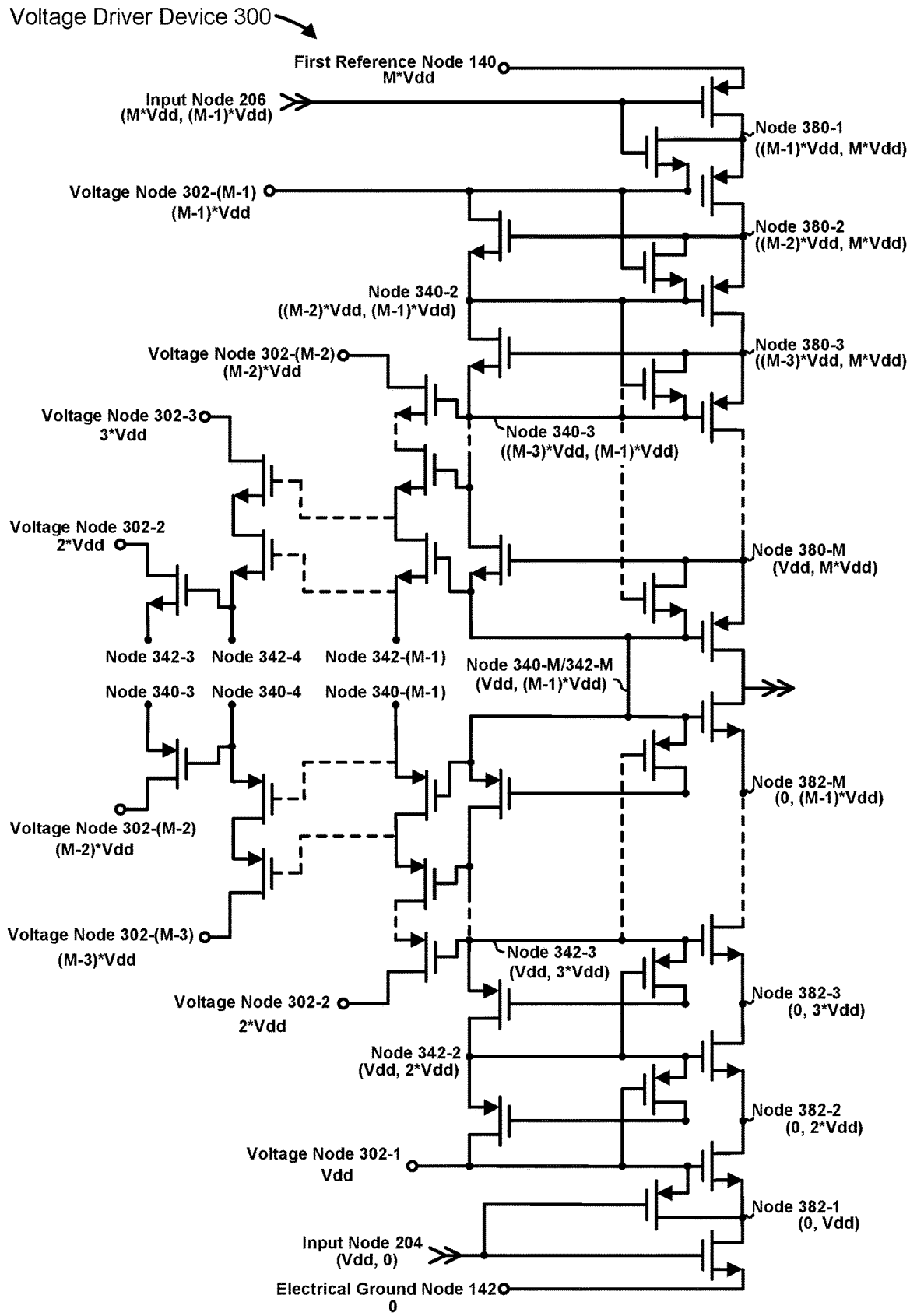

FIGS. 3A-3C are circuit diagrams illustrating a voltage driver device 300 in accordance with some embodiments. Whereas FIGS. 2A-2B illustrate an example voltage driver device 200 with four PCTDs stacked over four NCTDs (e.g., an M=4 device), FIGS. 3A-3C illustrate a more general M-over-M device. For brevity, FIGS. 3A-3C are discussed together, with FIG. 3A showing reference numbers for respective nodes, FIG. 3B illustrating how the transistor devices shown in FIG. 3A are organized into blocks for performing certain functions, and FIG. 3C showing the voltages on respective nodes when a binary input of either $V_{dd}$ or 0 is applied to input node 204 (e.g., as with FIG. 2B, when the input voltage is $V_{dd}$, the nodes take on the first voltage in their respective parentheses, and when the input voltage is 0, the nodes take on the second voltage in their respective parentheses).

Voltage driver device 300 includes a first set of positive channel transistor devices (PCTDs) 350 (e.g., PCTDs 120-1 through 120-M) coupled in series between a first reference node 140 and an output node 146. The first set of PCTDs 120 includes an integer number M of transistor devices (e.g., at least 3) and is otherwise analogous to the first set of PCTDs 120 shown in FIG. 1. Voltage driver device 300 includes a first set of negative channel transistor devices (NCTDs) 352 (e.g., NCTD 122-1 through NCTD 122-M) coupled in series between the output node 146 and electrical ground node 142. The first set of NCTDs 122 includes the same integer number, M (e.g., at least 3), of transistor devices as the first set of PCTDs 120, and is otherwise analogous to the first set of NCTDs 122 shown in FIG. 1. The first set of PCTDs 120 and the first set of NCTDs 122 comprise a driver circuit 110, as shown in FIG. 1. The respective gates of PCTDs 120 are represented as nodes 340 (e.g., nodes 340-3, 340-4, and 340-M). The respective gates of NCTDs 122 are represented as nodes 342 (e.g., nodes 342-3, 342-4, and 342-M).

Voltage driver device 300 includes a control circuit (e.g., as shown in FIG. 1) coupled to the driver circuit. The control circuit includes a speed-up circuit coupled to the driver circuit. The speed-up circuit includes a second set of NCTDs 354 (comprising M−1 NCTDs, e.g., NCTDs 322-1 through 322-(M−1)) coupled to the first set of PCTDs 350 and configured to selectively discharge gate-source capacitances of the first set of PCTDs 350. The speed-up circuit further includes a second set of PCTDs 356 (comprising M−1 PCTDs, e.g., PCTDs 320-1 through 320-(M−1)) coupled to the first set of NCTDs 122 and configured to selectively discharge gate-source capacitances of the first set of NCTDs 122.

Voltage driver device 300 includes a gate voltage circuit coupled to the driver circuit. The gate voltage circuit includes a third set of NCTDs 358 (coupled to the second set of NCTDs 354) and a third set of PCTDs 360 (coupled to the second set of PCTDs 356). The gate voltage circuit is configured to selectively provide respective first and second gate voltages (e.g., as indicated by the voltages in FIG. 3C) to each of: at least a subset of the first set of PCTDs 120, and at least a subset of the first set of NCTDs 122. The gate voltage circuit also includes voltage reference nodes 302 (e.g., voltage reference nodes 302-1 through 302-(M−1)), in addition to first reference node 140 and electrical ground node 142.

Nodes 340 provide gate voltages to respective PCTDs 120 in the first set of PCTDs 120. For example, node 340-3 provides a gate voltage to PCTD 120-3; node 340-4 provides a gate voltage to PCTD 120-4; node 340-(M−1) provides a gate voltage to PCTD 120-(M−1) (not shown); and node 340-M provides a gate voltage to PCTD 120-M.

Nodes 342 provide gate voltages to respective NCTDs 122 in the first set of NCTDs 122. For example, node 342-3 provides a gate voltage to NCTD 122-3; node 342-4 provides a gate voltage to NCTD 122-4; node 342-(M−1) provides a gate voltage to NCTD 122-(M−1) (not shown); and node 342-M provides a gate voltage to NCTD 122-M.

In FIG. 3C, nodes 380 (e.g., node 380-1 through 380-M) illustrate voltages in the stack of PCTDs 120. Nodes 382 (e.g., node 382-1 through 382-M) illustrate voltages in the stack of NCTDs 122.

Figure 4A:
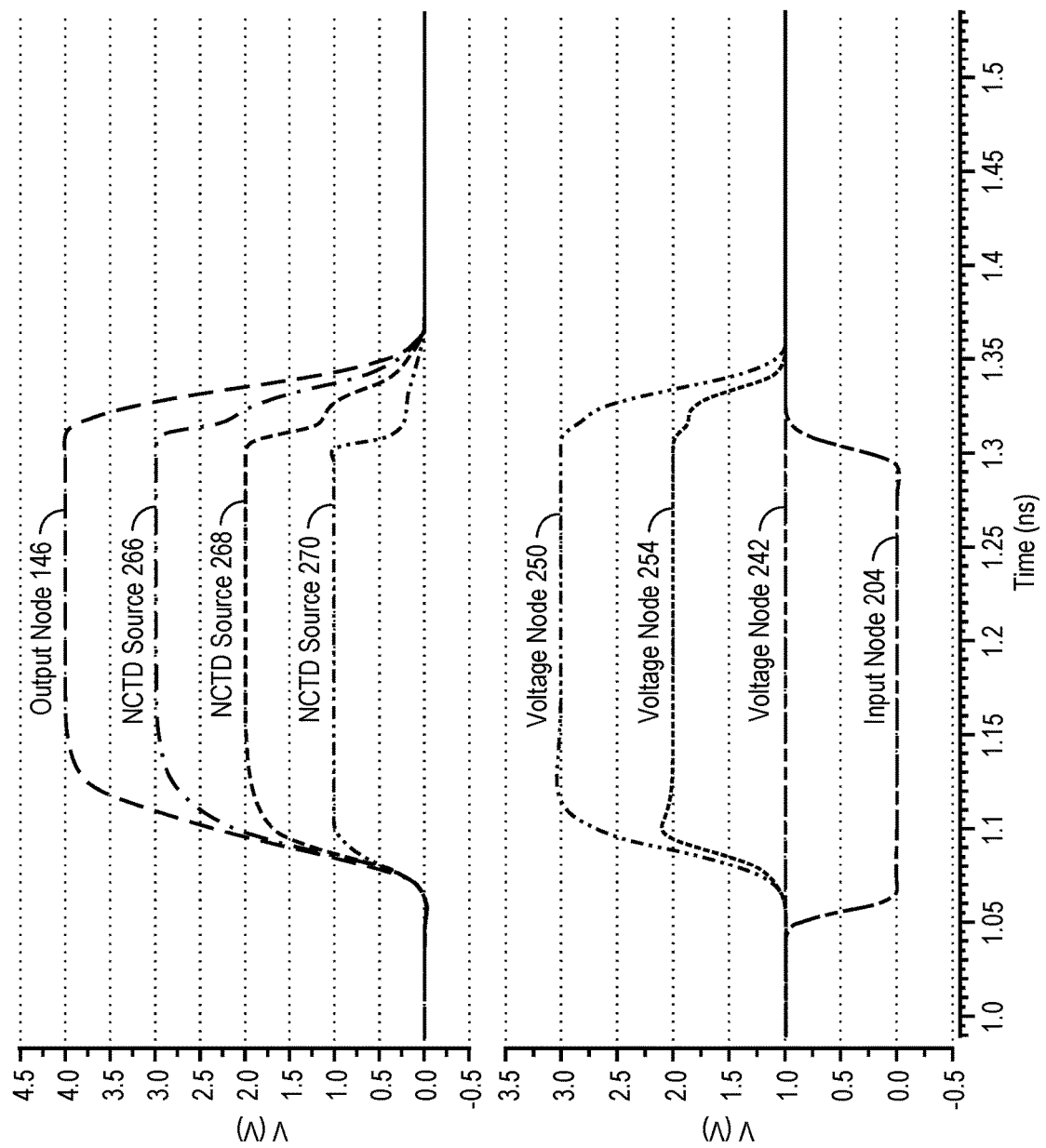
FIGS. 4A-4B are plots showing simulated response times of various nodes of a voltage driver device in accordance with some embodiments.
Figure 4B:
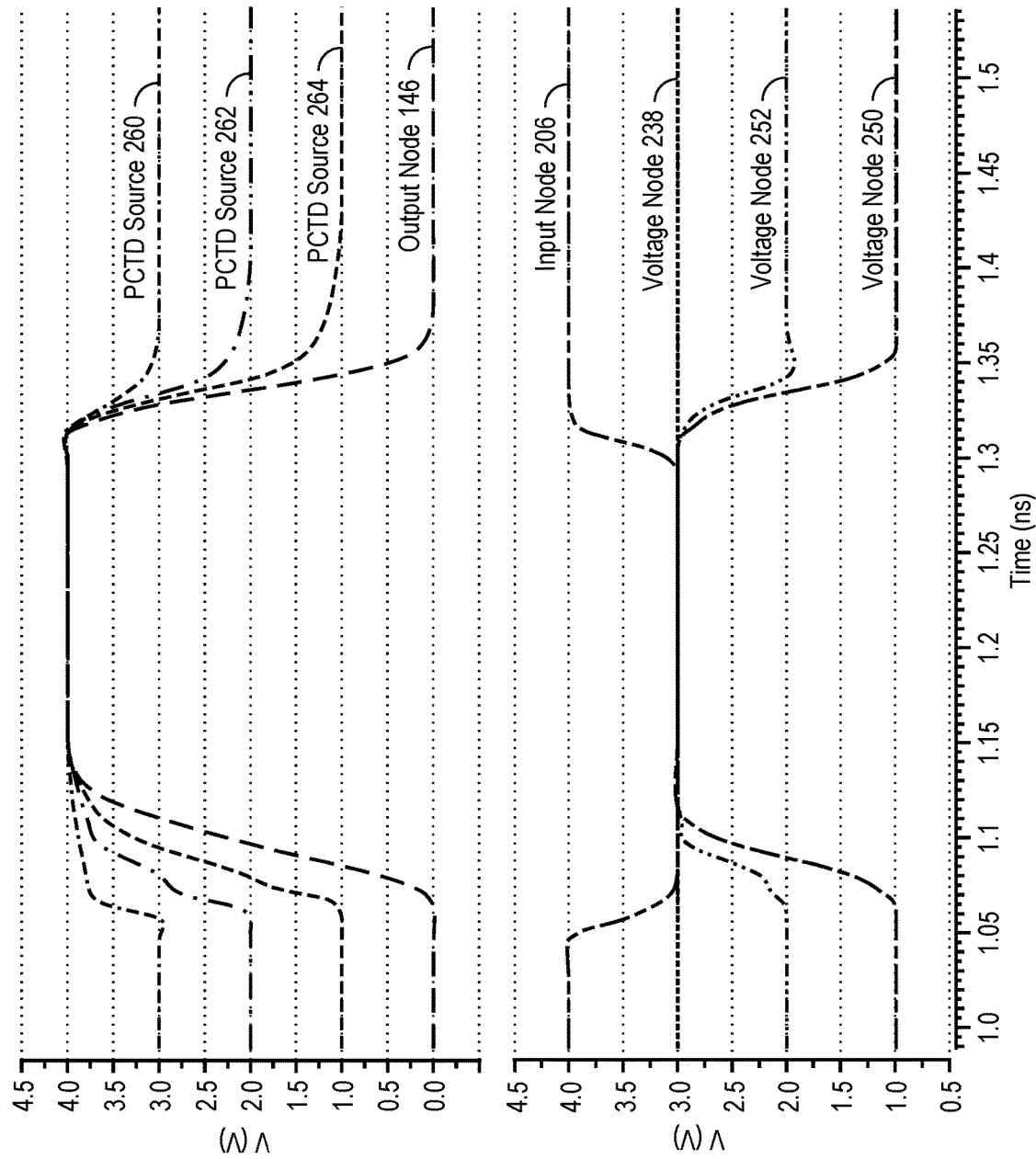

Returning to an example of a 4-over-4 voltage driver device, FIGS. 4A-4B are plots showing simulated response times of various nodes of a voltage driver device 200 (FIGS. 2A-2B), in accordance with some embodiments. In particular, FIGS. 4A-4B illustrate an example in which the voltage driver device 200 is transitioned from the first mode (in which all of the NCTDs 122 are on, all of the PCTDs 120 are off, and the output node 146 is pulled to ground) to the second mode (in which all of the PCTDs 120 are on, all of the NCTDs 122 are off, and the output node 146 is pushed to the voltage on the first reference node 140, which in this example is 4 V), and then back to the first mode.

As shown in FIG. 4A-4B, when transitioning from the first mode to the second mode, the voltage on the output node 146 changes first, while the NCTDs 122 are sequentially transitioned (with NCTD 122-4 turning off first as shown by voltage on NCTD source 266; NCTD 122-3 turning off second as shown by the voltage on NCTD source 268; and NCTD 122-2 turning off third, as shown by the voltage on NCTD source 270). Stated another way, when transitioning from the first mode to the second mode, the NCTDs 122 are sequentially turned off, with the NCTD in the driver circuit closest to the output node 146 beginning to transition from on to off first, the NCTD in the driver circuit second closest to the output node 146 beginning to transition from on to off second, and progressing sequentially until the NCTD in the driver circuit furthest from the output node begins to transition from on to off. The transitions from on to off of the NCTDs in the driver circuit overlap in time, but are initiated sequentially, starting with the NCTD closest to the output node, in order of their positions relative to the output node 146. When transitioning from the second mode to the first mode, the NCTDs are sequentially transitioned in the opposite order, starting with the NCTD in the driver circuit farthest from the output node 146 beginning to transition from off to on first, and progressing sequentially until the NCTD in the driver circuit closest to the output node 146 begins to transition from off to on. The transitions from off to on of the NCTDs in the driver circuit overlap in time, but are initiated sequentially, starting with the NCTD farthest from the output node 146, in order of their positions relative to the output node 146, until the transition from off to on of NCTD closest to the output node is initiated.

A similar pattern is observed with respect to the PCTDs 120, as shown in FIG. 4B. In particular, when transitioning from the first mode to the second mode, the PCTDs 120 are sequentially turned on, with the PCTD in the driver circuit farthest from the output node 146 beginning to transition from off to on first, the PCTD in the driver circuit second farthest from the output node 146 beginning to transition from off to on second, and progressing sequentially until the PCTD in the driver circuit closest to the output node 146 begins to transition from off to on. The transitions from off to on of the PCTDs in the driver circuit overlap in time, but are initiated sequentially, starting with the NCTD farthest from the output node 146, in order of their positions relative to the output node 146. When transitioning from the second mode to the first mode, the PCTDs are sequentially transitioned in the opposite order, starting with the PCTD in the driver circuit closest to the output node 146 beginning to transition from on to off first, and progressing sequentially until the PCTD in the driver circuit farthest from the output node 146 begins to transition from on to off. The transitions from on to off of the PCTDs in the driver circuit overlap in time, but are initiated sequentially, starting with the PCTD closest to the output node 146, in order of their positions relative to the output node 146, until the transition from on to off of PCTD farthest from the output node is initiated.

As can be seen from FIGS. 4A-4B, voltage device driver 200 can drive an output voltage from 0 V to 4 V in well under 100 picoseconds (e.g., 80 picoseconds) and can drive the output voltage from 4 V to 0 V even faster (e.g., 50 picoseconds).

Figure 5:
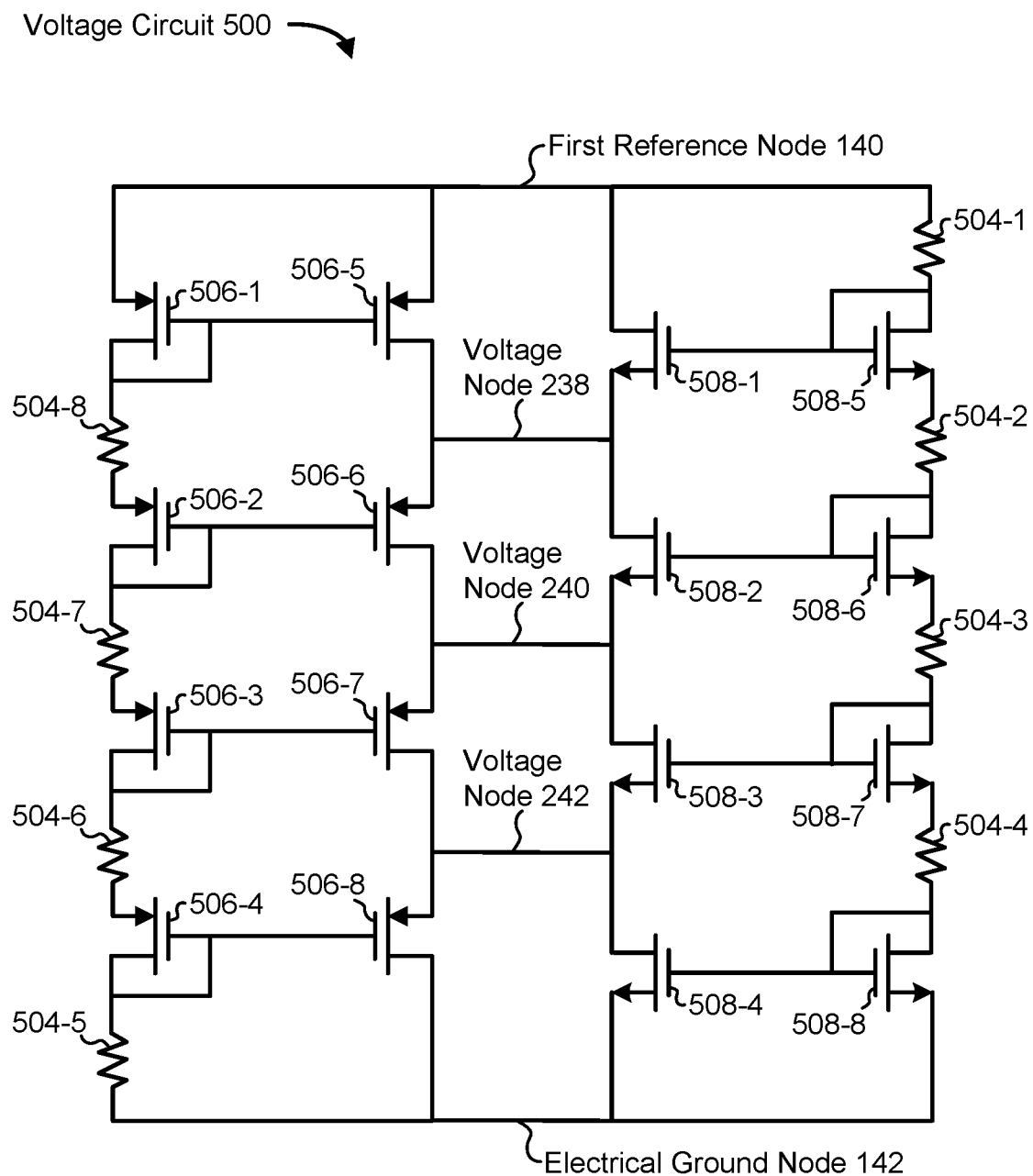
FIG. 5 is a circuit diagram illustrating a voltage circuit (e.g., a voltage divider) in accordance with some embodiments.

FIG. 5 is a circuit diagram illustrating a voltage circuit 500 (e.g., a voltage divider) in accordance with some embodiments. In some embodiments of the voltage driver devices described previously, only one NCTD and one PCTD are driven by the input voltage (e.g., NCTD 122-1 and PCTD 120-1, FIG. 1). Thus, there is a need for a circuit that generates gate voltages for the rest of the transistor devices such that the voltage across each transistor device does not damage the transistor device. In addition, in some embodiments, each transistor device is biased so as to minimize its on resistance, which improves the efficiency and speed of the overall driver.

Voltage circuit 500 includes a set of resistors 504 (e.g., resistor 504-1 through resistor 504-8); a set of PCTDs 506 (e.g., PCTD 504-1 through PCTD 504-4); and a set of NCTDs 508 (e.g., NCTD 508-1 through 508-4). PCTDs 506, along with resistors 504-5 through 504-8, form a p-type current mirror. NCTDs 508, along with resistors 504-1 through 504-4, form an n-type current mirror. Voltage circuit 500 has a high AC-impedance, which stabilizes the reference voltages (e.g., the voltages on voltage nodes 238, 240, and 242) while the voltage driver device 200 (FIGS. 2A-2B) switches at a high frequency.

In this example, voltage circuit 500 is a circuit for providing the reference voltages on voltage node 238, voltage node 240, and voltage node 242, respectively, as shown in FIGS. 2A-2B. Thus, voltage circuit 500 is configured to provide three reference voltages. More generally, voltage circuit 500 is configured to provide M-1 reference voltages (e.g., where M is the number of PCTDs in the first set of PCTDs 120). The M-1 reference voltages are between zero and the voltage on the first reference node (e.g., in this case 4*$V_{dd}$). These M-1 reference voltages correspond to respective multiples of the average drain-to-source voltage drop across the PCTDs in the first set of PCTDs 120 in the first mode (e.g., with all of the PCTDs in an off state), and respective multiples of the average drain-to-source voltage drop across the NCTDs in the first set of NCTDs 122 in the second mode (e.g., with all of the NCTDs in an off state). In some embodiments, the voltage driver device 200 is configured such that the average drain-to-source voltage drop, when transistor devices are in an off state, is the power supply voltage $V_{dd}$. In some embodiments, the respective first and second gate voltages are each: zero voltage, the voltage on the first reference node, or one of the M-1 reference voltages. For example, as described with reference to FIGS. 2A-2B, the gate voltages for each of the first set of PCTDs 120 and the first set of NCTDs 122 take on values that are one of zero, the voltage on the first reference node 140 (e.g., 4*$V_{dd}$), or the voltage from one of the voltage nodes 238, 240, and 240 (e.g., $V_{dd}$, 2*$V_{dd}$, and 3*$V_{dd}$, respectively).

It will be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A voltage driver device, comprising:
   a driver circuit, comprising:
      a first set of positive channel transistor devices (PCTDs) coupled in series between a first reference node and an output node, wherein the first set of PCTDs includes at least three PCTDs; and
      a first set of negative channel transistor devices (NCTDs) coupled in series between the output node and an electrical ground node, wherein the first set of NCTDs includes at least three NCTDs; and
   a control circuit coupled to the driver circuit, the control circuit comprising:
      a speed-up circuit coupled to the driver circuit, comprising:
         a second set of NCTDs coupled to the first set of PCTDs and configured to selectively discharge gate-source capacitances of the first set of PCTDs; and
         a second set of PCTDs coupled to the first set of NCTDs and configured to selectively discharge gate-source capacitances of the first set of NCTDs;
         wherein the speed-up circuit is configured to speed-up operation of the driver circuit via the selective discharging of gate-source capacitances; and
      a gate voltage circuit coupled to the driver circuit and comprising a third set of NCTDs and a third set of PCTDs, wherein the gate voltage circuit is configured to selectively provide respective first and second gate voltages to each of: at least a subset of the first set of PCTDs, and at least a subset of the first set of NCTDs.

2. The voltage driver device of claim 1, wherein each transistor device in the first set of PCTDs and the first set of NCTDs has a same associated drain-to-source reliability voltage threshold; and wherein a voltage difference between the first reference node and the electrical ground node is more than two times the drain-to-source reliability voltage threshold.

3. The voltage driver device of claim 2, wherein the driver circuit is configured to operate in:

a first mode during which the first set of NCTDs are in an on state and the first set of PCTDs are in an off state; and a second mode during which the first of PCTDs are in an on state and the first set of NCTDs are in an off state; and wherein the control circuit is configured to transition the driver circuit between the first mode and the second mode by:

sequentially transitioning on respective PCTDs in the first set of PCTDs such that a magnitude of a drain-to-source voltage of each PCTD in the first set of PCTDs does not exceed the drain-to-source reliability voltage threshold; and sequentially transitioning off respective NCTDs in the first set of NCTDs such that a magnitude of a drain-to-source voltage of each NCTD in the first set of NCTDs does not exceed the drain-to-source reliability voltage threshold.

4. The voltage driver device of claim 3, wherein the voltage difference between the first reference node and the electrical ground node is M times greater than an average drain-to-source voltage drop across the PCTDs in the first set of PCTDs in the first mode, and is M times greater than the average drain-to-source voltage drop across the NCTDs in the first set of NCTDs in the second mode;

wherein the first set of PCTDs includes M PCTDs; and
wherein the first set of NCTDs includes M NCTDs.

5. The voltage driver device of claim 4, further comprising a voltage circuit configured to provide M−1 reference voltages, between zero and the voltage on the first reference node, corresponding to respective multiples of the average drain-to-source voltage drop across the PCTDs in the first set of PCTDs in the first mode, and respective multiples of the average drain-to-source voltage drop across the NCTDs in the first set of NCTDs in the second mode.

6. The voltage driver device of claim 5, wherein the respective first and second gate voltages are each: zero voltage, the voltage on the first reference node, or one of the M−1 reference voltages.

7. The voltage driver device of claim 1, further comprising an input circuit coupled to the driver circuit, the input circuit including:

one or more signal buffers; and
a level shifting circuit configured to adjust a level of an input signal to correspond to the voltage on the first reference node.

8. The voltage driver device of claim 1, wherein, for each NCTD of the second set of NCTDs:

a source terminal of the NCTD is electrically connected to a gate terminal of a first corresponding PCTD of the first set of PCTDs;

a drain terminal of the NCTD is electrically connected to a source terminal of the first corresponding PCTD;

a gate terminal of the NCTD is electrically connected to a gate terminal of a second corresponding PCTD of the first set of PCTDs; and the source terminal of the first corresponding PCTD is electrically connected to a drain terminal of the second corresponding PCTD; and wherein, for each PCTD of the second set of PCTDs:

a drain terminal of the PCTD is electrically connected to a source terminal of a first corresponding NCTD of the first set of NCTDs;

a gate terminal of the PCTD is electrically connected to a gate terminal of a second corresponding NCTD;

a source terminal of the PCTD is electrically connected to a gate terminal of the first corresponding NCTD of the first set of NCTDs; and a source terminal of the first corresponding NCTD is electrically connected to the drain terminal of the second corresponding NCTD.

* * * * *